US010242935B2

(12) United States Patent
Carpenter et al.

(10) Patent No.: US 10,242,935 B2
(45) Date of Patent: Mar. 26, 2019

(54) PACKAGED SEMICONDUCTOR DEVICE AND METHOD FOR FORMING

(71) Applicant: NXP USA, INC., Austin, TX (US)

(72) Inventors: Burton Jesse Carpenter, Austin, TX (US); Leo M. Higgins, III, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/691,797

(22) Filed: Aug. 31, 2017

(65) Prior Publication Data

US 2019/0067172 A1   Feb. 28, 2019

(51) Int. Cl.
*H01L 23/495* (2006.01)
*H01L 23/31* (2006.01)
*H01L 21/48* (2006.01)
*H01L 21/56* (2006.01)

(52) U.S. Cl.
CPC .... *H01L 23/49548* (2013.01); *H01L 21/4825* (2013.01); *H01L 21/4842* (2013.01); *H01L 21/565* (2013.01); *H01L 23/3114* (2013.01); *H01L 23/4952* (2013.01); *H01L 23/49503* (2013.01)

(58) Field of Classification Search
None
See application file for complete search history.

(56) References Cited

U.S. PATENT DOCUMENTS

| 5,545,921 | A | 8/1996 | Conru et al. |
| 6,608,366 | B1 | 8/2003 | Fogelson et al. |
| 7,629,676 | B2 | 12/2009 | Otremba et al. |
| 7,960,818 | B1 | 6/2011 | Davis et al. |
| 8,329,509 | B2 | 12/2012 | Gong et al. |
| 8,648,456 | B1 | 2/2014 | Mahler et al. |
| 2004/0089926 | A1 | 5/2004 | Hsu et al. |
| 2007/0181984 | A1 | 8/2007 | Son et al. |
| 2007/0262409 | A1* | 11/2007 | Nozaki ............. H01L 23/49503 257/487 |

FOREIGN PATENT DOCUMENTS

| JP | 62-188252 A | 8/1987 |
| JP | 03-152964 A | 6/1991 |

* cited by examiner

*Primary Examiner* — Eva Y Montalvo
*Assistant Examiner* — Kevin Quinto

(57) ABSTRACT

A packaged semiconductor device includes a die attached to a die flag of a lead frame wherein the die includes a first, second, third, and fourth minor side, wherein the first and second minor sides are opposite each other and the third and fourth minor sides are opposite each other. The device includes an outer-most lead of the lead frame extending outwardly from the first minor side of the die and closest to the third minor side, wherein the outer-most lead includes a thinned region located between the die and a full thickness portion of the outer-most lead. The device includes an electrical connection between the die and the outer-most lead, and an encapsulant surrounding the die, the electrical connection, and surrounding at least a portion of an outer edge of the thinned portion of the outer-most lead such that the full thickness portion of the outer-most lead extends beyond the encapsulant.

22 Claims, 4 Drawing Sheets

PACKAGED SEMICONDUCTOR DEVICE AND METHOD FOR FORMING

BACKGROUND

Field

This disclosure relates generally to packaged semiconductor devices, and more specifically, to packaged semiconductor devices optimized for creepage distance.

Related Art

In packaged semiconductor devices, creepage distance is defined as the shortest distance between two conductive parts, along the surface of a separating insulator, minus the length of any conductive elements in the path that are isolated from the two conductive parts. As an example of an issue that can arise with creepage distance, assume leads on one side of the package are used for high voltage signals and leads on the opposing side of the package are used for low voltage signals. In the JEDEC JESD4 (11/83) standard specification for packaged semiconductor devices, creepage distance between low voltage and high voltage leads is required to be greater than or equal to a specified distance, such as, for example, 8.000 millimeters (mm), on the outside surface of the package to assure high voltage isolation. This requirement has not been possible to meet using standard lead frame and package designs when the worst case dimensional conditions are assumed. For example, the creepage distance under the worst case dimensional conditions (maximum lead width, maximum lead frame tin plating thickness, minimum molded body length, etc.) may only meet a creepage distance of less than 8.000 mm, which is unacceptable, while the creepage distance under nominal and best case dimensional conditions exceed 8.000 mm. It is not only desirable but required to meet the creepage requirements even under worst case dimensional conditions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In order to increase creepage distance and meet creepage requirements, a packaged semiconductor device is formed having a lead frame, a mold body, and mold extensions. The mold extensions wrap around an outer edge of outer most leads in order to increase the creepage distance. The mold extensions are formed as a result of a thinned portion of the lead frame, in which the outer most leads of each die site in a lead frame array include a thinned region which extends from the location of a mold body edge through at least a portion of the dam bar. In this manner, the mold cavity of the mold tool includes extensions along those leads having the thinned portions up to the full thickness portions of the dam bars. In the mold tool, the resin which forms the mold or encapsulant fills the space in between the leads and fills the mold cavity extensions. By forming these mold extensions on corresponding outer leads of opposite sides of the packaged device, the total creepage distance of the outer leads is increased as compared to not having the mold extensions.

Figure 1:
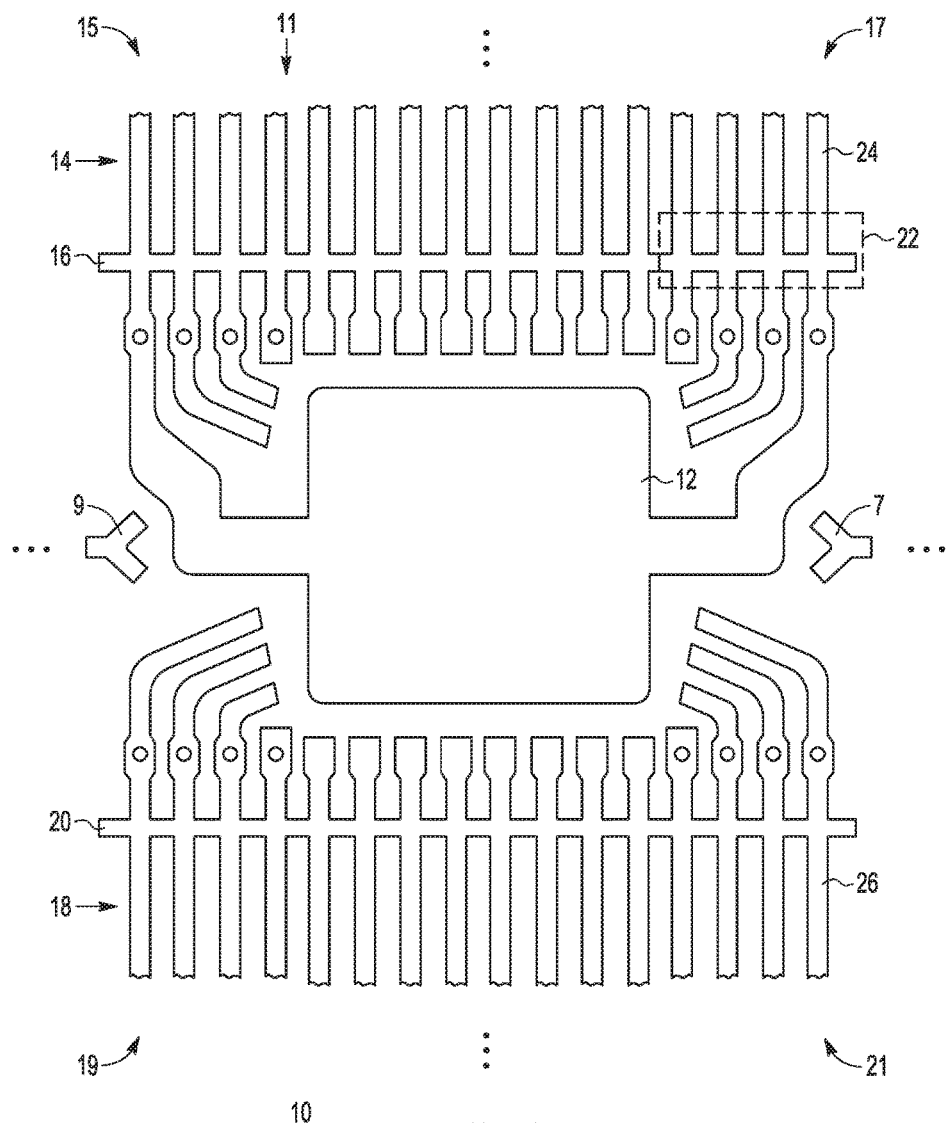
FIG. 1 illustrates a top down view of a lead frame in accordance with one embodiment of the present invention.

FIG. 1 illustrates a top down view of an embodiment of a packaged semiconductor device 10 at an initial stage in processing. Device 10 includes a lead frame 11 which includes a die flag 12, a plurality of leads 14 extending from a first side of lead frame 11, a dam bar 16 running across and connecting all leads 14, a plurality of leads 18 extending from a second side of lead frame 11, opposite from the first side, a dam bar 20 running across and connecting all leads 20, and retention bars 9 and 7. Dam bars 16 and 20 are each continuous pieces of lead frame metal connecting all external leads. The function of the dam bars is to provide a clamping surface for a mold tool, and to stop mold compound from flowing past that point during the molding process. A portion 22 of lead frame 11 will be illustrated in further detail in FIGS. 3, 4, and 6. Lead frame 11 corresponds to one die site of an array of die sites, which can extend above, below, to the right., or to the left of the illustrated die site. Also, lead frame 11 can be divided into 4 quadrants, including an upper-left quadrant 15, an upper-right quadrant 17, a lower-left quadrant 19, and a lower-right quadrant 21.

Still referring to FIG. 1, a lead 24 is a right outer-most lead of the leads 14 and extends through portion 22, and a lead 26 is a right outer-most lead of leads 18 and extends opposite lead 24. Therefore, lead 24 is an outer-most lead of quadrant 17 and of lead frame 11 and lead 26 is an outer-most lead of quadrant 21 and of lead frame 11. Some of leads 14 and some of leads 18 include angled portions close to die flag 12 so as to allow leads 14 and 18 to fan out from die flag 12. As will be seen in more details in subsequent figures below, lead frame 11 includes thinned and non-thinned regions (with the non-thinned regions corresponding to regions having the full lead frame thickness). The thinned regions, as will be seen below, will allow for the extension of a subsequently formed encapsulant which results in an increased creepage distance, such as between outer-most lead 24 and outer-most lead 26.

In alternate embodiments, the shape of the leads of lead frame 11 may differ. For example, they may include further bends as they extend outwardly from the die flag. Also, although in the illustrated embodiment, leads extend from two sides of lead frame 11, in alternate embodiments, leads may extend from one or more sides of lead frame 11. Retention bars 9 and 7 connect with retention bars of adjacent die sites, and may also have different shapes.

Figure 2:
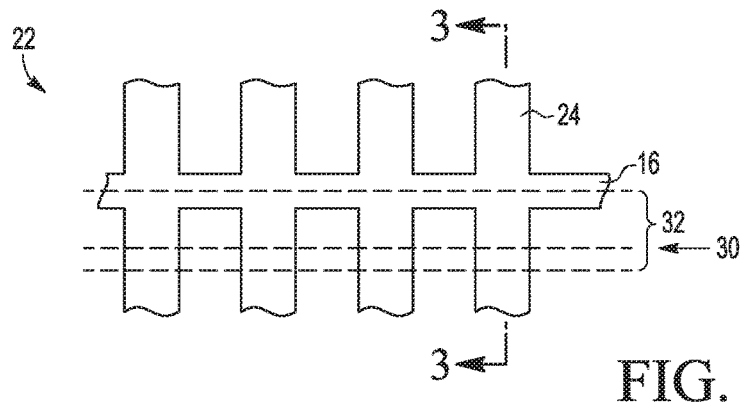
FIG. 2 illustrates a top down view of a zoomed in portion in one quadrant of the lead frame of FIG. 1, in accordance with one embodiment of the present invention.

FIG. 2 illustrates a top down, zoomed-in view of portion 22 of FIG. 1 in quadrant 17. In FIG. 2, a dashed line extending through leads 14 represents the location of an edge 32 of a clamp of the mold tool which will be used to subsequently encapsulate the device. Therefore, edge 30 represents the outer edge of the subsequently formed mold body of the device (i.e. the outer edge of the mold body region). Lead frame 11 includes a thinned region 32, in which the lead fame is thinner than the remaining lead frame portions (such as the remaining portions of the dam bar and leads, also referred to as the full thickness portions). In the illustrated embodiment, thinned region 32 is a region which includes about half the width of dam bar 16 and portions of each lead extending downward from dam bar 16 towards die flag 12. Thinned region 32 extends into the mold body region, surpassing edge 30. That is, thinned region 32 extends further down towards die flag 12 than edge 30.

Thinned region 38 extends across lead frame 11, across both quadrants 15 and 17. A similar thinned region is located in the lower half of lead frame 11, across both quadrants 19 and 21. In an alternate embodiment, thinned region 32 may not cover all leads of quadrant 17. That is, thinned region 32 may include a portion of dam bar 16 and a portion of lead 24 (the outer-most lead of quadrant 17), but not include any of the remaining leads in quadrant 17. Therefore, each quadrant may include a thinned region which includes a portion of the corresponding dam bar and the outer-most lead of the corresponding quadrant. Also, the interface between thinned region 32 and the full thickness portion occurs in the dam bar region of dam bar 16. That is, the dam bar region of dam bar 16 corresponds to dam bar 16 as well as the portion of each lead crossed by dam bar 16. Therefore, even after dam bar 16 is cut from between the leads, each lead still includes a portion of the dam bar region.

Figure 3:
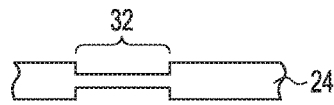
FIG. 3 illustrates a cross section of the portion of FIG. 2.

FIG. 3 illustrates a cross section of portion 22 of FIG. 2 which illustrates thinned region 32 and the remaining full lead frame thickness portion of lead 24. In one embodiment, thinned region 32 is formed by double quarter etching in which both major surfaces of the lead frame are etched to reduce the thickness. In another embodiment, thinned region 32 is formed by stamping in which both major surfaces are stamped. In one embodiment, the full lead fame thickness is reduced by 50% in the thinned regions. For example, the full lead frame thickness outside of the thinned regions is 200 micrometers, while the thickness in the thinned regions is 100 micrometers. The lead frame may be provided with pre-formed thinned regions by the lead frame manufacturer. Alternatively, the thinned regions may be formed after receiving the lead frame from the lead frame manufacturer. Note that the thinned portion is recessed from both major surfaces of lead frame 11. In this manner, as will be seen below, encapsulant can be formed on both sides of the thinned portions of the lead.

Figure 4:
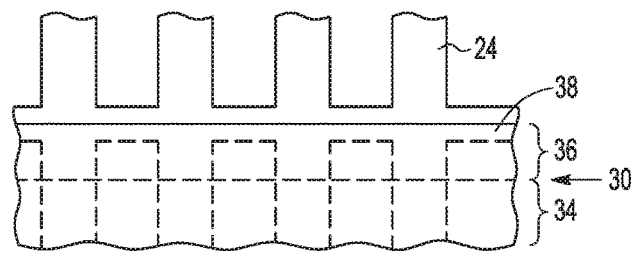
FIG. 4 illustrates the portion of FIG. 2 at a subsequent processing stage, in accordance with one embodiment of the present invention.

FIG. 4 illustrates a top down view of portion 22 of FIG. 2 at a subsequent stage in processing. Prior to use of the mold tool to encapsulate the device, a die is attached to each die flag of the lead frame, such as die flag 12, and wire bonds are formed between the die and leads of the lead frame, such as leads 14 and 18. Die may be attached to the die flags and wire bonds formed using conventional processing techniques. Lead frame 11 with the attached die and wire bonds is then placed into the mold tool wherein encapsulant 38 is formed which surrounds the attached die and wire bonds.

Figure 5:
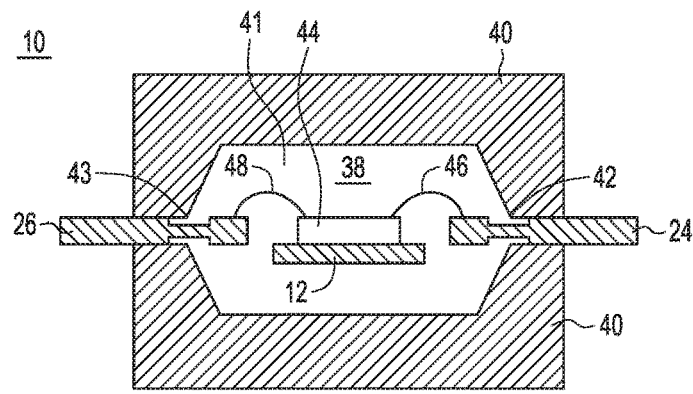
FIG. 5 illustrates a cross-sectional view of the lead frame of FIG. 1 at the processing stage of FIG. 4.

FIG. 5 illustrates a cross-section view of device 10 with lead frame 11 in a mold cavity 41 of the mold tool. Illustrated in FIG. 5 is die 44 which has a first major side attached to die flag 12, wire bond 48 which connects a first I/O pad of a second major side of die 44 to lead 26, and wire bond 46 which connects a second I/O pad of the second major side of die 44 to lead 24. Leads 14, including lead 24, extend outwardly from a first minor side of die 44, and leads 18, including lead 26, extend outwardly from a second minor side of die 44, opposite the first minor side. In alternate embodiments, lead frame 11 may include leads extending from a third or a fourth minor side, or both the third and fourth minor sides. However, in the illustrated embodiment, no leads extend from the third or fourth minor side of die 44.

Still referring to FIG. 5, mold cavity 41 is formed by clamp 40 which clamps to the upper and lower major surfaces of lead frame 11 at dam bars 16 and 20. The upper and lower clamps of clamp 40 are each concave such that clamp cavity 41 surrounds die 44, wire bonds 48 and 46, and thinned regions of lead frame 11, such as thinned region 32. Due to the thinned regions of lead frame 11, clamp cavity 41 includes extensions which extend until the full thickness portions of the dam bars 16 and 20. Therefore, during molding with clamps 40 in place, mold compound resin (also referred to as encapsulant material) flows between the leads up to the full thickness portion of the dam bars, filling the space between the leads to form encapsulant 38. The full thickness portions of the leads are directly in contact and pressed against the clamps, so the surfaces of the full thickness portions of the leads will not be covered by the resin. Due to the thinned regions of the lead frame, encapsulant 38 also forms along both major surfaces of leads 24 and 26 between the closest surfaces of the upper and lower clamps of clamp 41, up to the full thickness portions of the dam bars.

Note that edge 42 of mold cavity 41 formed by clamps 40 corresponds with edge 30 of FIGS. 2 and 4. Edge 42 occurs, when moving from the widest portion of cavity 41 towards the narrower portion to the right, at the first point where the upper and lower clamps of clamp 40 are closest to each other. On the opposite side of FIG. 5, wherein lead 26 is located, a similar edge 43 occurs, when moving from the widest portion of cavity 41 towards the narrower portion to the left, at the first point where the upper and lower clamps of clamp 40 are closest to each other. The portion of the encapsulant formed within cavity 41 up to edges 42 and 43 corresponds to the mold body region while the portion of the encapsulant formed beyond edges 42 and 43, outward towards the ends of the leads up to the full thickness portions of the dam bar, corresponds to the mold extensions, which extend from the mold body region.

Referring back to FIG. 4, encapsulant 38 has both a thick portion 34 and a thin portion 36. Thin portion 36 extends from edge 30 (corresponding to edge 42 of clamp 40) to the full thickness portion of dam bar 16, and corresponds to the mold extension. Thick portion 34 is formed by the concave portions of clamp cavity 41 between edges 42 and 43, and corresponds to the mold body (or mold body region) of singulated device 10.

Figure 6:
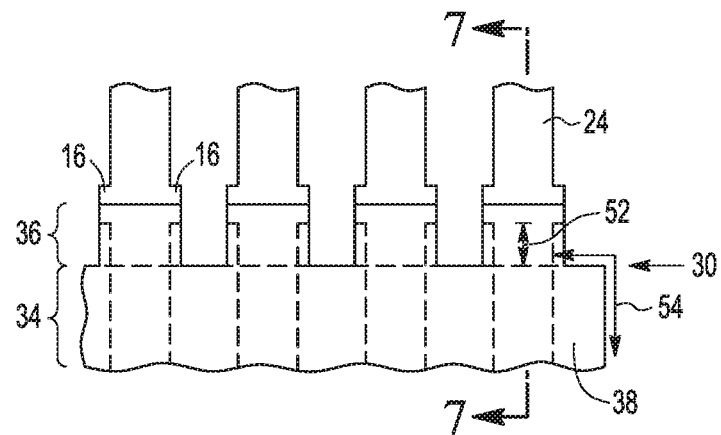
FIG. 6 illustrates a top down view of the portion of FIG. 4 at a subsequent processing stage, in accordance with one embodiment of the present invention.

FIG. 6 illustrates portion 22 of FIG. 4 at a subsequent stage in processing, in accordance to an embodiment of the present invention. After encapsulant 38 is formed and the lead frame removed from the mold tool, assembly trim-and-form is performed, in which the dam bars are cut to isolate each lead, thus enabling electrical functionality of the device. Simultaneously, a portion of encapsulant 38 (e.g., a portion of portion 36) that flowed between the leads due to the thinned portions of lead frame 11 is cut. Therefore, as illustrated in FIG. 6, a portion of encapsulant 36 is cut (back to edge 30) when dam bar 16 is cut between the leads, and small portions (i.e. remnants) of dam bar 16 remain adjacent either side of each lead. This isolates leads 14 from each other that were previously connected by dam bar 16. The same occurs in the other 3 quadrants, since dam bar 20 is also cut between the leads to isolate leads 18. As discussed above, the interface between thinned region 32 of lead 24 and the full thickness portion of lead 24 occurs in the dam bar region of lead 24, which corresponds to the location of previously present dam bar 16. Also, during trim-and-form, the leads can be bent as needed for assembly.

As illustrated in FIG. 6 due to thinned region 32, the creepage distance is increased by distance 52, which extends from thick portion 34 of encapsulant 38 to a bottom edge of the remnants of dam bar 16. That is, with prior art techniques in which lead frame 11 does not include thinned regions which extend between closest surfaces of the upper and lower clamps, encapsulant 38 ends at edge 30 (corresponding to edge 42 of clamp 40). Therefore, without the mold extensions, the creepage distance in the prior art begins with distance 54, whereas the creepage distance in FIG. 6 with the mold extensions begins with distance 52 in addition to distance 54. Therefore, the extension of encapsulant along the thinned regions results in thin portion 36 of encapsulant surrounding a portion of an outer edge of outer-most lead 24 (below the remnants of dam bar 16), increasing the creepage distance by distance 52.

The same applies to the outer edges of the outer-most leads of the other 3 quadrants, such as, for example, lead 26. In this manner, with encapsulant 38 extending onto lead 26 in a similar manner and surrounding an outer edge of lead 26, the creepage distance is further increased by a distance similar to distance 52. This is because the creepage distance corresponds to the shortest distance between conductors (e.g. leads 24 and 26) along any insulating surface (e.g. encapsulant 38, including portions of the thin extension portions). The same result can also be obtained with quadrants 15 and 19. While, at a minimum, the outer leads of each quadrant having thinned regions allows for an increased creepage distance, more than just the outer leads may include a thinned region, such as region 32 illustrated in FIG. 3 which spans multiple leads of quadrant 17. Therefore, in one embodiment, only outer leads of each array site of a lead frame include a thinned region.

Figure 7:
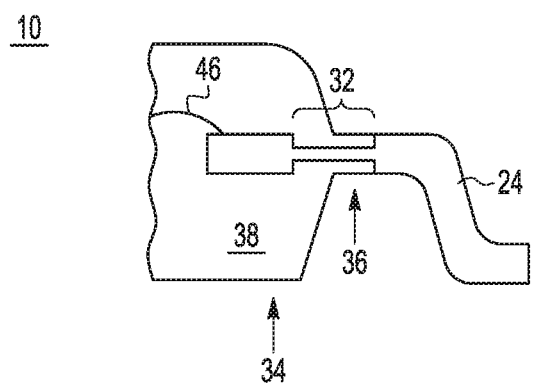
FIG. 7 illustrates, in cross-section form, a portion of the substantially completed packaged semiconductor device using the lead frame of FIG. 1, in accordance with one embodiment of the present invention.

FIG. 7 illustrates a cross-sectional view of device 10 of FIG. 6 after singulation, with the external leads, such as leads 24, bent downwards. In FIG. 7, both thick portion 34 and thin portion 36 of encapsulant 38 can be seen, as allowed by thinned region 32. Thick portion 34 may be referred to as the mold body or mold body region and thin portion 36 may be referred to as mold extensions, which extend beyond the mold body. Thinned region 32 of lead 24 is located between die 44 (not visible in the portion of FIG. 7) and the full thickness portion of lead 24. Encapsulant 38 surrounds die 44, die flag 12, and wire bond 46. Encapsulant 38 also surrounds at least an outer edge of thinned region 32 of lead 24 such that the full thickness portion of lead 24 extends outwardly beyond encapsulant 38 (beyond the body region). Encapsulant 38 does not surround the full thickness portion of lead 24.

Figure 8:
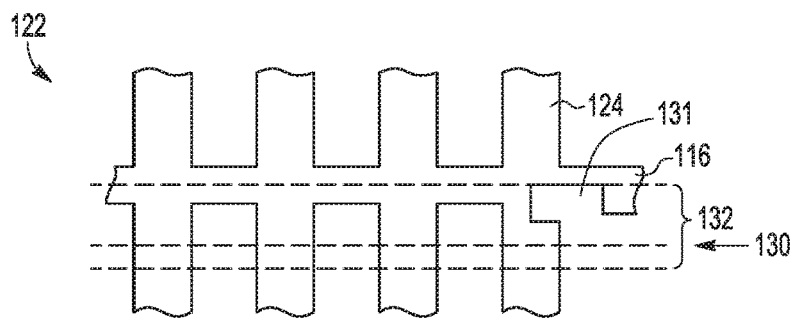
FIG. 8 illustrates a top down view of a portion of a quadrant of a lead frame in accordance with an alternate embodiment of the present invention.

FIG. 8 illustrates an alternate embodiment in which an outer lead of a quadrant of a lead frame, analogous to quadrant 17, has a cut-out region 131 to further increase creepage distance. Illustrated in FIG. 8 is a portion 122 that is analogous to portion 22 of FIG. 3. Portion 122 includes an outer most lead 124, analogous to lead 24, a dam bar 116, analogous to dam bar 16, and a thinned region 132, analogous to thinned region 32. Also illustrated in FIG. 3 is an edge 130 analogous to edge 30 which corresponds to the edge of the mold body to be subsequently formed (and thus corresponds with edge 42 of the mold tool).

Figure 9:
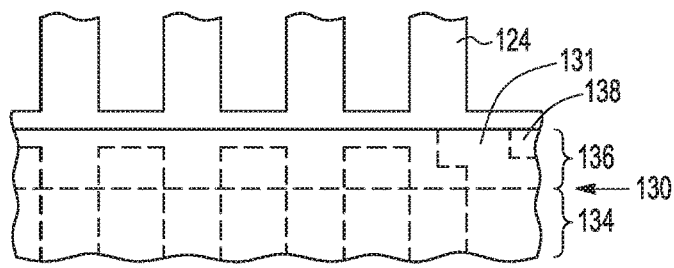
FIG. 9 illustrates a top down view of the portion of FIG. 8 at a subsequent processing stage, in accordance with one embodiment of the present invention.

FIG. 9 illustrates portion 122 of FIG. 8 at a subsequent stage in processing. As in the processing stage of FIG. 4, a die is attached to the die flag of the lead frame and wire bonds are formed, and the lead frame is placed in the mold tool, as shown in FIG. 5, to form encapsulant 138, also having a thin portion 136 (i.e. mold extension) and a thick portion 134 (i.e. mold body region). Thin portion 136 extends outwardly from edge 130 due to thinned region 132, analogous to thin portion 36 due to thinned region 32.

Figure 10:
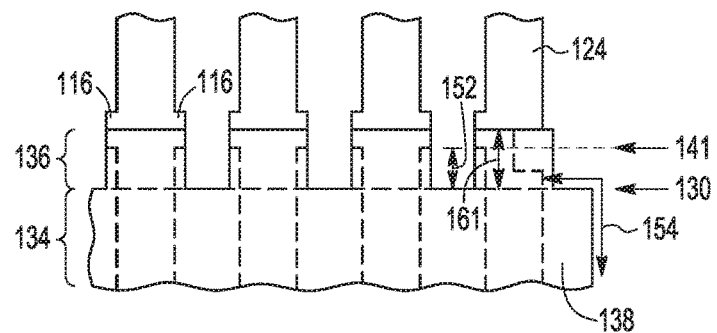
FIG. 10 illustrates a top down view of the portion of FIG. 9 at a subsequent processing stage, in accordance with one embodiment of the present invention

FIG. 10 illustrates portion 122 of FIG. 9 at a subsequent stage after assembly and trim-and-form is performed, in which the dam bars (e.g. dam bar 116) are cut to isolate each lead, thus enabling electrical functionality of the device. Simultaneously, a portion of encapsulant 138 (e.g., a portion of portion 136) that flowed between the leads due to the thinned portions of the lead frame is cut back to edge 130. Therefore, as illustrated in FIG. 10, a portion of encapsulant 136 is cut when dam bar 116 is cut between the leads. Note that, as in FIG. 6 above, small portions of dam bar 116 remain on either side of each lead. Also, note that a portion of encapsulant 136 surrounds a portion of the outer edge of lead 124 that has been cut out by cut-out region 131. Also, during trim-and-form, the leads can be bent as needed for assembly.

In the illustrated embodiment, the creepage distance is increased by a distance 152 due to encapsulant 136 encapsulating the thinned lead portion. Similar to the situation described above in reference to FIG. 6, without the mold extensions, the creepage distance in the prior art begins with distance 154 only, whereas the creepage distance in FIG. 10 with the mold extensions over the thinned lead portions begins with distance 152 in addition to distance 154. Distance 152 is the distance from mold body edge 130 to a lower edge 141 of the dam bar. Furthermore, cut-out region 131 allows for an increased creepage distance as compared to the embodiment of FIG. 6 since the creepage distance extends all the way to the edge of the thin portion 136 of the encapsulant (as illustrated by distance 161) as opposed to extending only to the beginning of the dam bar (as illustrated by distance 152). Therefore, the extension of encapsulant along the thinned regions results in thin portion 136 of encapsulant surrounding an outer edge of outer-most lead 124 that has been cut out by cut-out region 131, increasing the creepage distance over the prior art by distance 161.

In other alternate embodiments, different cut out shapes may be used to form cut-out regions such as region 131. Also, the thinned regions may extend to cover more or less of the dam bar, so long as some outer portion of the dam bar is left at full thickness so that the mold resin is blocked from leaking beyond the dam bar during the formation of the encapsulant in the mold tool.

Therefore, by now it should be appreciated how thinned regions of outer-most leads of a lead frame allows for the formation of mold extensions which extend beyond the mold body region. These mold extensions, which wrap around the outer edge of the outer-most leads increases the creepage distance of a device as compared to devices without such extensions. This allows for the ability to meet the creepage requirements even under worst case dimensional conditions.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the thinned regions of the lead frame may not be centered within the full thickness of the lead frame, so long as there is space above and below the thinned region for resin to flow. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a packaged semiconductor device includes a die attached to a die flag of a lead frame wherein the die includes a first minor side, a second minor side, a third minor side, and a fourth minor side, wherein the first and second minor side are opposite each other and the third and fourth minor side are opposite each other; an outer-most lead of the lead frame extending outwardly from a first minor side of the die and closest to the third minor side, wherein the outer-most lead includes a thinned region located between the die and a full thickness portion of the outer-most lead; an electrical connection between the die and the outer-most lead; and an encapsulant surrounding the die, the electrical connection, and surrounding at least a portion of an outer edge of the thinned portion of the outer-most lead such that the full thickness portion of the outer-most lead extends beyond the encapsulant. In one aspect of this embodiment, the thinned region of the outer-most lead is recessed from both a first major side and a second major side of the outer-most lead. In another aspect, a thickness of the thinner region is at most half a thickness of the full thickness portion. In yet another aspect, the encapsulant surrounding the die and the electrical connection corresponds to a mold body region of the encapsulant, and the encapsulant surrounding the outer edge of the thinned portion of the outer-most lead corresponds to a mold extension which extends from the body region, and wherein a thickest portion of the mold extension on each side of the thinned region of the outer-most lead is at most 25% of a thickness of the full thickness portion of the outer-most lead. In another aspect, the thinned region of the outer-most lead comprises a cut out from the outer edge, wherein the encapsulant surrounds the cut out of the outer edge. In yet another aspect, the packaged semiconductor device includes a second outer-most lead of the lead frame extending outwardly from the second minor side of the die and closest to the third minor side, wherein the second outer-most lead includes a thinned region located between the die and a full thickness portion of the second outer-most lead, and wherein the encapsulant surrounds at least a portion of an outer edge of the thinned portion of the second outer-most lead such that the full thickness portion of the second outer-most lead extends beyond the encapsulant. In a further aspect, the first outer most lead is directly opposite the second outer most lead. In yet a further aspect, a creepage distance of the packaged semiconductor device includes a distance from an edge closest to the die of dam bar remnants adjacent to the first outer-most lead to an edge closest to the die of dam bar remnants adjacent the second outer-most lead. In another aspect of the above embodiment, the packaged semiconductor device further includes a second outer most lead of the lead frame extending outwardly from the first minor side of the die and closest to the fourth minor side, wherein the second outer-most lead includes a thinned region located between the die and a full thickness portion of the second outer-most lead, and wherein the encapsulant surrounds at least an outer edge of the thinned portion of the second outer-most lead such that the full thickness portion of the second outer-most lead extends beyond the encapsulant. In a further aspect, the packaged semiconductor device further includes a plurality of leads extending outwardly from the first minor side of the die, between the first and second outer-most leads, wherein each lead includes a thinned portion located between the die and a full thickness portion of the lead, and wherein the encapsulant is formed on both major surfaces of the thinned portion of the lead. In another aspect, an interface between the thinned region and the full thickness portion of the outer-most lead is located within a dam bar region of the outer-most lead.

In another embodiment, a method for forming a packaged semiconductor device includes attaching a die to a die flag of a lead frame, wherein the die includes a first minor side, a second minor side, a third minor side, and a fourth minor side, wherein the first and second minor side are opposite each other and the third and fourth minor side are opposite each other; forming an electrical connection between the die and an outer-most lead extending outwardly from a first minor side of the die closest to the third minor side, wherein the outer-most lead includes a thinned region located between the die and a full thickness portion of the outer-most lead; and forming an encapsulant surrounding the die, the electrical connection, and surrounding at least a portion of an outer edge of the thinned portion of the outer-most lead such that the full thickness portion of the outer-most lead extends beyond the encapsulant. In one aspect of this another embodiment, the lead frame includes a plurality of leads extending outwardly from the first minor side and the second minor side of the die, wherein each lead of the plurality of leads includes a full thickness portion, wherein forming the encapsulant includes clamping the lead frame with a clamp of a mold tool, thereby forming a clamp cavity, wherein the clamp clamps onto the full thickness portion of the outer-most lead and the full thickness portion of each lead of the plurality of leads; and filling the clamp cavity with encapsulant material, wherein the encapsulant material fills spaces between the leads of the plurality of leads and surrounds the thinned region of the outer-most lead up until the full thickness portion of the outer-most lead. In another aspect, the method further includes forming an electrical connection between the die and a second outer-most lead extending outwardly from the second minor side of the die and closest to the third minor side, wherein the second outer-most lead includes a thinned region located between the die and a full thickness portion of the second outer-most lead, and forming the encapsulant is performed such that the encapsulant surrounds at least a portion of an outer edge of the thinned portion of the second outer-most lead such that the full thickness portion of the second outer-most lead extends beyond the encapsulant. In a further aspect, the lead frame includes a plurality of leads, including the first and the second outer-most leads, and the method further includes performing a trim and form to isolate the plurality of leads from each other, wherein, after the trim and form, a creepage distance of the packaged semiconductor device includes a distance from an edge closest to the die of dam bar remnants adjacent to the first outer-most lead to an edge closest to the die of dam bar remnants adjacent the second outer-most lead. In yet another aspect, the lead frame includes a second outer-most lead extending outwardly from the first minor side of the die and closest to the fourth minor side, wherein the second outer-most lead includes a thinned region located between the die and a full thickness portion of the second outer-most lead, a plurality of leads between the outer-most lead and the second outer-most lead extending outwardly from the first minor side of the die, and a dam bar extending across the outer-most lead, the plurality of leads, and the second outer-most leads, wherein an outer portion of the dam bar furthest from the die and along the entire dam bar has a full lead frame thickness. In a further aspect, forming the encapsulant includes clamping the lead frame with a clamp of a mold tool, thereby forming a clamp cavity, wherein the clamp clamps onto the full thickness portion of the outer-most lead, the full thickness portion of the second outer-most lead, and the outer portion of the dam bar; and filling the clamp cavity with encapsulant material, wherein the encapsulant material fills spaces between the leads of the plurality of leads and surrounds the thinned regions of the outer-most lead and the second outer-most lead up until the outer portion of the dam bar having the full lead frame thickness.

In yet another embodiment, a packaged semiconductor device includes a die attached to a die flag of a lead frame wherein the die includes a first minor side, a second minor side, a third minor side, and a fourth minor side, wherein the first and second minor side are opposite each other and the third and fourth minor side are opposite each other; an outer-most lead of the lead frame extending outwardly from a first minor side of the die and closest to the third minor side, wherein the outer-most lead includes a thinned region located between the die and a full thickness portion of the outer-most lead; an electrical connection between the die and the outer-most lead; and an encapsulant having: a mold body region surrounding the die, die flag, and the electrical connection, and a mold extension extending from the mold body region and surrounding at least a portion of an outer edge of the thinned portion of the outer-most lead such that the full thickness portion of the outer-most lead extends from the mold extension. In a further aspect, the packaged semiconductor device further includes a second outer most lead of the lead frame extending outwardly from an opposite side of the first minor side of the die and closest to the fourth minor side, wherein the second outer-most lead includes a thinned region located between the die and a full thickness portion of the second outer-most lead, and wherein the encapsulant surrounds at least a portion of an outer edge of the thinned portion of the second outer-most lead such that the full thickness portion of the second outer-most lead extends beyond the encapsulant; and a plurality of leads extending outwardly from the first minor side of the die, between the first and second outer-most leads, wherein each lead includes a thinned portion located between the die and a full thickness portion of the lead, and wherein the encapsulant is formed on both major surfaces of the thinned portion of the lead. In another aspect of this yet another embodiment, the thinned region of the outer-most lead comprises a cut out from the outer edge, wherein the encapsulant surrounds the cut out of the outer edge.

What is claimed is:

1. A packaged semiconductor device comprising:
   a die attached to a die flag of a lead frame wherein the die includes a first minor side, a second minor side, a third minor side, and a fourth minor side, wherein the first and second minor side are opposite each other and the third and fourth minor side are opposite each other;
   an outer-most lead of the lead frame extending outwardly from a first minor side of the die and closest to the third minor side, wherein the outer-most lead includes a thinned region located between the die and a full thickness portion of the outer-most lead;
   an electrical connection between the die and the outer-most lead;
   an encapsulant surrounding the die, the electrical connection, and surrounding at least a portion of an outer edge of the thinned portion of the outer-most lead such that the full thickness portion of the outer-most lead extends beyond the encapsulant,
   wherein the encapsulant surrounding the die and the electrical connection corresponds to a mold body region of the encapsulant, and the encapsulant surrounding the outer edge of the thinned portion of the outer-most lead corresponds to a mold extension which extends from the body region, and wherein a thickest portion of the mold extension on each side of the thinned region of the outer-most lead is at most 25% of a thickness of the full thickness portion of the outer-most lead.

2. The packaged semiconductor device of claim 1, wherein the thinned region of the outer-most lead is recessed from both a first major side and a second major side of the outer-most lead.

3. The packaged semiconductor device of claim 1, wherein a thickness of the thinner region is at most half a thickness of the full thickness portion.

4. The packaged semiconductor device of claim 1, wherein the thinned region of the outer-most lead comprises a cut out from the outer edge, wherein the encapsulant surrounds the cut out of the outer edge.

5. The packaged semiconductor device of claim 1, wherein an interface between the thinned region and the full thickness portion of the outer-most lead is located within a dam bar region of the outer-most lead.

6. The packaged semiconductor device of claim 1, further comprising a second outer most lead of the lead frame extending outwardly from the first minor side of the die and closest to the fourth minor side, wherein the second outer-most lead includes a thinned region located between the die and a full thickness portion of the second outer-most lead, and wherein the encapsulant surrounds at least an outer edge of the thinned portion of the second outer-most lead such that the full thickness portion of the second outer-most lead extends beyond the encapsulant.

7. The packaged semiconductor device of claim 6, further comprising a plurality of leads extending outwardly from the first minor side of the die, between the first and second outer-most leads, wherein each lead includes a thinned portion located between the die and a full thickness portion of the lead, and wherein the encapsulant is formed on both major surfaces of the thinned portion of the lead.

8. A packaged semiconductor device comprising:
   a die attached to a die flag of a lead frame wherein the die includes a first minor side, a second minor side, a third minor side, and a fourth minor side, wherein the first and second minor side are opposite each other and the third and fourth minor side are opposite each other;
   an outer-most lead of the lead frame extending outwardly from a first minor side of the die and closest to the third minor side, wherein the outer-most lead includes a thinned region located between the die and a full thickness portion of the outer-most lead;
   an electrical connection between the die and the outer-most lead; and
   an encapsulant surrounding the die, the electrical connection, and surrounding at least a portion of an outer edge of the thinned portion of the outer-most lead such that the full thickness portion of the outer-most lead extends beyond the encapsulant;
   a second outer-most lead of the lead frame extending outwardly from the second minor side of the die and closest to the third minor side, wherein the second outer-most lead includes a thinned region located between the die and a full thickness portion of the second outer-most lead, and wherein the encapsulant surrounds at least a portion of an outer edge of the thinned portion of the second outer-most lead such that the full thickness portion of the second outer-most lead extends beyond the encapsulant,
   wherein the first outer most lead is directly opposite the second outer most lead, and
   wherein a creepage distance of the packaged semiconductor device includes a distance from an edge closest to the die of dam bar remnants adjacent to the first outer-most lead to an edge closest to the die of dam bar remnants adjacent the second outer-most lead.

9. A method for forming a packaged semiconductor device, comprising:
   attaching a die to a die flag of a lead frame, wherein the die includes a first minor side, a second minor side, a third minor side, and a fourth minor side, wherein the first and second minor side are opposite each other and the third and fourth minor side are opposite each other;
   forming an electrical connection between the die and a first outer-most lead extending outwardly from a first minor side of the die closest to the third minor side, wherein the first outer-most lead includes a thinned region located between the die and a full thickness portion of the outer-most lead;
   forming an encapsulant surrounding the die, the electrical connection, and surrounding at least a portion of an outer edge of the thinned region of the first outer-most lead such that the full thickness portion of the first outer-most lead extends beyond the encapsulant;
   forming an electrical connection between the die and a second outer-most lead extending outwardly from the second minor side of the die and closest to the third minor side, wherein the second outer-most lead includes a thinned region located between the die and a full thickness portion of the second outer-most lead, and wherein the lead frame comprises a plurality of leads, including the first and the second outer-most leads;
   forming the encapsulant is performed such that the encapsulant surrounds at least a portion of an outer edge of the thinned region of the second outer-most lead such that the full thickness portion of the second outer-most lead extends beyond the encapsulant;
   performing a trim and form to isolate the plurality of leads from each other, wherein, after the trim and form, a creepage distance of the packaged semiconductor device includes a distance from an edge closest to the die of dam bar remnants adjacent to the first outer-most lead to an edge closest to the die of dam bar remnants adjacent the second outer-most lead.

10. The method of claim 9, wherein the lead frame includes a plurality of leads extending outwardly from the first minor side and the second minor side of the die, wherein each lead of the plurality of leads includes a full thickness portion, wherein forming the encapsulant comprises:
    clamping the lead frame with a clamp of a mold tool, thereby forming a clamp cavity, wherein the clamp clamps onto the full thickness portion of the outer-most lead and the full thickness portion of each lead of the plurality of leads; and
    filling the clamp cavity with encapsulant material, wherein the encapsulant material fills spaces between the leads of the plurality of leads and surrounds the thinned region of the outer-most lead up until the full thickness portion of the outer-most lead.

11. The method of claim 9, wherein the lead frame comprises:
    a second outer-most lead extending outwardly from the first minor side of the die and closest to the fourth minor side, wherein the second outer-most lead includes a thinned region located between the die and a full thickness portion of the second outer-most lead,
    a plurality of leads between the outer-most lead and the second outer-most lead extending outwardly from the first minor side of the die, and
    a dam bar extending across the outer-most lead, the plurality of leads, and the second outer-most leads, wherein an outer portion of the dam bar furthest from the die and along the entire dam bar has a full lead frame thickness.

12. The method of claim 11, wherein forming the encapsulant comprises:
    clamping the lead frame with a clamp of a mold tool, thereby forming a clamp cavity, wherein the clamp clamps onto the full thickness portion of the outer-most lead, the full thickness portion of the second outer-most lead, and the outer portion of the dam bar; and
    filling the clamp cavity with encapsulant material, wherein the encapsulant material fills spaces between the leads of the plurality of leads and surrounds the thinned regions of the outer-most lead and the second outer-most lead up until the outer portion of the dam bar having the full lead frame thickness.

13. A packaged semiconductor device comprising:
    a die attached to a die flag of a lead frame wherein the die includes a first minor side, a second minor side, a third minor side, and a fourth minor side, wherein the first and second minor side are opposite each other and the third and fourth minor side are opposite each other;

an outer-most lead of the lead frame extending outwardly from a first minor side of the die and closest to the third minor side, wherein the outer-most lead includes a thinned region located between the die and a full thickness portion of the outer-most lead;

an electrical connection between the die and the outer-most lead; and an encapsulant having:
   a mold body region surrounding the die, die flag, and the electrical connection, and
   a mold extension extending from the mold body region and surrounding at least a portion of an outer edge of the thinned portion of the outer-most lead such that the full thickness portion of the outer-most lead extends from the mold extension.

14. The packaged semiconductor device of claim 13, further comprising:
   a second outer most lead of the lead frame extending outwardly from an opposite side of the first minor side of the die and closest to the fourth minor side, wherein the second outer-most lead includes a thinned region located between the die and a full thickness portion of the second outer-most lead, and wherein the encapsulant surrounds at least a portion of an outer edge of the thinned portion of the second outer-most lead such that the full thickness portion of the second outer-most lead extends beyond the encapsulant; and
   a plurality of leads extending outwardly from the first minor side of the die, between the first and second outer-most leads, wherein each lead includes a thinned portion located between the die and a full thickness portion of the lead, and wherein the encapsulant is formed on both major surfaces of the thinned portion of the lead.

15. The package semiconductor device of claim 13, wherein the thinned region of the outer-most lead comprises a cut out from the outer edge, wherein the encapsulant surrounds the cut out of the outer edge.

16. A packaged semiconductor device comprising:
   a die attached to a die flag of a lead frame wherein the die includes a first minor side, a second minor side, a third minor side, and a fourth minor side, wherein the first and second minor side are opposite each other and the third and fourth minor side are opposite each other;
   an outer-most lead of the lead frame extending outwardly from a first minor side of the die and closest to the third minor side, wherein the outer-most lead includes a thinned region located between the die and a full thickness portion of the outer-most lead;
   an electrical connection between the die and the outer-most lead; and
   an encapsulant surrounding the die, the electrical connection, and surrounding at least a portion of an outer edge of the thinned portion of the outer-most lead such that the full thickness portion of the outer-most lead extends beyond the encapsulant,
   wherein an interface between the thinned region and the full thickness portion of the outer-most lead is located within a dam bar region of the outer-most lead.

17. The packaged semiconductor device of claim 16, wherein the thinned region of the outer-most lead is recessed from both a first major side and a second major side of the outer-most lead.

18. The packaged semiconductor device of claim 16, wherein a thickness of the thinner region is at most half a thickness of the full thickness portion.

19. The packaged semiconductor device of claim 16, wherein the thinned region of the outer-most lead comprises a cut out from the outer edge, wherein the encapsulant surrounds the cut out of the outer edge.

20. The packaged semiconductor device of claim 16, further comprising:
   a second outer-most lead of the lead frame extending outwardly from the second minor side of the die and closest to the third minor side, wherein the second outer-most lead includes a thinned region located between the die and a full thickness portion of the second outer-most lead, and wherein the encapsulant surrounds at least a portion of an outer edge of the thinned portion of the second outer-most lead such that the full thickness portion of the second outer-most lead extends beyond the encapsulant.

21. The packaged semiconductor device of claim 16, further comprising a second outer most lead of the lead frame extending outwardly from the first minor side of the die and closest to the fourth minor side, wherein the second outer-most lead includes a thinned region located between the die and a full thickness portion of the second outer-most lead, and wherein the encapsulant surrounds at least an outer edge of the thinned portion of the second outer-most lead such that the full thickness portion of the second outer-most lead extends beyond the encapsulant.

22. A method for forming a packaged semiconductor device, comprising:
   attaching a die to a die flag of a lead frame, wherein the die includes a first minor side, a second minor side, a third minor side, and a fourth minor side, wherein the first and second minor side are opposite each other and the third and fourth minor side are opposite each other;
   forming an electrical connection between the die and an outer-most lead extending outwardly from a first minor side of the die closest to the third minor side, wherein the outer-most lead includes a thinned region located between the die and a full thickness portion of the outer-most lead; and
   forming an encapsulant surrounding the die, the electrical connection, and surrounding at least a portion of an outer edge of the thinned region of the outer-most lead such that the full thickness portion of the outer-most lead extends beyond the encapsulant, wherein an interface between the thinned region and the full thickness portion of the outer-most lead is located within a dam bar region of the outer-most lead.

* * * * *